(12) United States Patent
Hosseini et al.

(10) Patent No.: US 8,039,971 B2
(45) Date of Patent: Oct. 18, 2011

(54) ELECTRONIC CIRCUIT ARRANGEMENT

(75) Inventors: Khalil Hosseini, Weihmichl (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 564 days.

(21) Appl. No.: 11/752,147

(22) Filed: May 22, 2007

(65) Prior Publication Data
US 2007/0284757 A1    Dec. 13, 2007

(30) Foreign Application Priority Data
May 22, 2006  (DE) .................. 10 2006 023 998

(51) Int. Cl.
H01L 23/48      (2006.01)
(52) U.S. Cl. ................... 257/779; 257/E23.026
(58) Field of Classification Search .................. 257/779, 257/E23.026
See application file for complete search history.

(56) References Cited

U.S. PATENT DOCUMENTS

| | | | |
|---|---|---|---|
| 4,142,203 A | 2/1979 | Dietz | |
| 4,546,374 A | 10/1985 | Olsen et al. | |
| 5,188,984 A | 2/1993 | Nishiguchi | |
| 5,192,622 A | 3/1993 | Cammarano et al. | |
| 5,521,432 A * | 5/1996 | Tsuji et al. | 257/677 |
| 5,728,285 A * | 3/1998 | Mathew | 205/182 |
| 5,801,436 A | 9/1998 | Serizawa | |
| 6,352,634 B1 | 3/2002 | Förderer et al. | |
| 6,376,901 B1 | 4/2002 | Abbott | |
| 6,774,466 B1 | 8/2004 | Kajiwara et al. | |
| 6,969,905 B2 | 11/2005 | Paulus | |
| 7,109,587 B1 * | 9/2006 | Li | 257/779 |
| 7,690,551 B2 * | 4/2010 | You Yang | 228/56.3 |
| 2002/0027271 A1 * | 3/2002 | Vaiyapuri | 257/676 |
| 2002/0123164 A1 * | 9/2002 | Slater et al. | 438/39 |
| 2003/0102538 A1 | 6/2003 | Paulus | |
| 2006/0060981 A1 | 3/2006 | Paulus | |
| 2006/0113683 A1 * | 6/2006 | Dean et al. | 257/783 |

FOREIGN PATENT DOCUMENTS

| | | |
|---|---|---|
| DE | 100 31 204 A1 | 1/2002 |
| KR | 2002 094965 | 12/2002 |
| WO | WO 99/64198 | 12/1999 |

* cited by examiner

*Primary Examiner* — Zandra Smith
*Assistant Examiner* — Paul Patton
(74) *Attorney, Agent, or Firm* — Slater & Matsil, L.L.P.

(57) ABSTRACT

Electronic circuit arrangement, includes a chip and a chip carrier having a substrate and a chip contact location. At least the chip contact location is provided with a soldering layer. The chip includes a bonding layer. A silver layer for eutectic bonding with the bonding layer is provided on the soldering layer in the region of the chip contact location.

27 Claims, 2 Drawing Sheets

ELECTRONIC CIRCUIT ARRANGEMENT

This application claims priority to German Patent Application 10 2006 023 998.9, which was filed May 22, 2006, and is incorporated herein by reference.

TECHNICAL FIELD

The invention relates to an electronic circuit arrangement and also to a method for producing it.

BACKGROUND

An electronic circuit arrangement can include a semiconductor chip and a chip carrier, which are at least partly packaged in a housing (so-called packaging). The chip carrier for the at least one semiconductor chip has a plurality of functions in a finished package. It serves as a stable bearing and holding area to which the semiconductor chip is fixedly connected, dissipates heat that arises, and provides the electrical connections for the semiconductor chip. That is to say that it forms the contact elements for the electronic circuit arrangement which are connected to printed circuit boards, for example, in a further processing step.

The semiconductor chip is usually connected to a chip contact location of the chip carrier (so-called die pad). There are various methods for producing the necessary electrical contacts between the chip carrier and the semiconductor chip. In the case of wire bonding, the semiconductor chip is fixed on the chip contact location and connected to the contact elements of the chip carrier by means of fine wires. The chip contact location then often only forms an electrical conducting line for the semiconductor chip. Such wire bonding to a chip carrier is known for example from German patent application DE 100 31 204.

In the case of the flip-chip method, the unhoused semiconductor chip is applied directly to the contact elements of the chip carrier without further wiring. The chip contact location provides a plurality of contact elements with which the chip comes into electrical contact upon application to the chip carrier. The method is more efficient since all the connections are produced in one method step. In the case of very complex circuits, this technology often affords the only practical possibility for connection because hundreds of contacts can be realized. With the flip-chip method, it is possible here to utilize the entire area of the chip contact location for the connections. This is not possible, or is possible only to a very limited extent, in the case of wire bonding because wires would then cross one another and very probably make contact with one another.

In both cases it is important to produce a stable connection having high electrical and thermal conductivity between the chip carrier, specifically between the chip contact location, and the semiconductor chip.

The chip carrier has a substrate that forms its basic framework and is produced from metal, in particular copper, copper alloys, iron-nickel alloys, and other alloys.

For better further processing of the electronic circuit arrangement, the substrate is preferably provided with at least one soldering layer. Tin or SnPb alloys have been customary for this. Both variants have disadvantages, however. Thus, as is known, lead-containing alloys are avoided on account of the high toxicity. Tin-plated chip carriers tend to form so-called whiskers, acicular elongate crystals, which can lead to short circuits when the circuit arrangement is mounted on printed circuit boards. In order to avoid these problems, it is known from Korean patent application KR 2002 094965, for example, to use palladium-containing soldering layers composed of NiPd or NiPdAu alloys.

These soldering layers have the disadvantage, however, that eutectic bonding with metalized chips, for example, by means of an AuSn or AuAs alloy, is not possible. This is particularly problematic since stringent requirements with regard to reliability, stability and also thermal and electrical conductivity are made of the connection of the chip to the chip carrier.

U.S. Pat. No. 6,376,901 B1 discloses a chip carrier (a so-called leadframe) for integrated semiconductor circuits wherein a nickel layer is plated onto the metallic carrier over the whole area and a palladium layer is plated onto the nickel layer, selectively covering bonding locations of the leadframe. Soldering agent is applied to the nickel layer where parts of the circuit arrangement are intended to be applied to the carrier.

SUMMARY OF THE INVENTION

In one aspect, the present invention provides an electronic circuit arrangement and a method for producing it wherein a simple, stable connection having high thermal and electrical conductivity is produced between chip and chip carrier. This arrangement can be simply and functionally produced and processed further.

In one particular embodiment, an electronic circuit arrangement, includes a chip carrier having a substrate and a chip contact location, and also a chip, at least the chip contact location being provided with a soldering layer. The chip includes a bonding layer. A silver layer for eutectic bonding with the bonding layer is provided on the soldering layer in the region of the chip contact location.

One aspect of the invention therefore provides a silver layer as an adapter layer between the soldering layer and the bonding layer that forms a eutectic bonding between chip and chip carrier. The chip carrier can still have a soldering layer for further processing purposes, e.g., for soldering onto a printed circuit board. The eutectic bond produces a contact having high electrical and also thermal conductivity between the chip carrier and the chip which stably bonds them to one another. The silver layer can also be a silver alloy having a high silver content.

Preferably, the soldering layer is lead-free. The soldering layer is therefore nontoxic and ecologically safe and can be processed without particular protective precautions.

Preferably, the soldering layer includes a predominantly palladium-containing layer. Alloys having a high proportion of palladium have become established as a good lead replacement. The arrangement produced in this way is not harmful to the environment.

Preferably, the silver layer has a layer thickness of between approximately 0.5 and 20 micrometers, in particular of approximately 10 micrometers. The eutectic bonding is achieved particularly well in this way.

Preferably, the soldering layer includes three layers, an inner layer adjacent to the substrate and composed of nickel or a nickel alloy having a first thickness, a middle layer composed of palladium or a palladium alloy having a second thickness, and an outer layer composed of gold or a gold alloy having a third thickness. A soldering layer composed of an NiPdAu composition is preferred since it can advantageously be soldered during the further processing of the semiconductor element, is lead-free and does not give rise to whiskers. Preferably, therefore, the chip carrier comprises a lower substrate layer composed of copper followed by a nickel layer, a palladium layer and a gold layer.

Preferably, the first thickness lies within the range of between approximately 1 and 5 micrometers, and in particular is 2 micrometers, and/or the second thickness lies within the range of between approximately 10 and 200 nanometers, and is in particular 100 nanometers, and/or the third thickness lies within the range of between approximately 5 to 100 nanometers, and is in particular 60 nanometers. Such dimensions are particularly advantageous for the production and for the further processing of the circuit arrangement, comprising the chip carrier and the chip.

Preferably, the bonding layer comprises an AuSn or AuAs alloy. The chip is therefore metalized by these alloys.

Preferably, a surface of the chip carrier is provided with a soldering layer essentially over the whole area. That is to say that at least one side of the substrate is coated with the soldering layer uniformly and over the whole area. Consequently, the chip carrier can be produced uniformly. A complicated procedure for differing coating of the chip carrier is obviated. The production of the chip carrier can be configured in cost-effective and efficient fashion.

Preferably, the eutectic bonding comprises an AgAuSnPd phase formed from the initially produced AgAuSn layer.

From a method-technological standpoint, a method produces an electronic circuit arrangement having a chip carrier having a chip contact location and also a chip having a bonding layer. The chip carrier is provided with a soldering layer at least in the region of the chip contact location. The production method includes the application of a silver layer to the chip contact location and eutectic melting of the bonding layer onto the silver layer.

The chip with a bonding layer and also the chip carrier can therefore be produced in standardized fashion. For bonding, the silver layer is applied on the chip contact location and then fused with the bonding layer of the chip.

Preferably, the silver layer is applied galvanically and/or chemically, the thickness of the applied silver layer being within the range of between approximately 0.5 and 10 micrometers, in particular approximately 5 micrometers.

Preferably, the melting, that is to say the bonding of the chip to the chip carrier, is effected at a temperature of more than 300° C., for example, at approximately 380° C. An optimum eutectic bonding can thus be achieved for the alloys chosen. Such a choice of temperature yields the best thermal and electrical conductivity of the connection produced between chip and chip carrier. The melting point of the eutectic is so low that it is harmless for the rest of the components of the electronic circuit arrangement, in particular for the chip. On the other hand, the melting point is significantly higher than the maximum temperatures which usually occur when soldering the circuit arrangement onto printed circuit boards. Consequently, the eutectic bonding is not altered or even detached during soldering.

Preferably, the melting is effected at a contact pressure within the range of 5 to 40 megapascals (MPa), in particular at 30 megapascals. The connection quality can also be enhanced by an optimum choice of the contact pressure of the chip carrier onto the chip. Very good results can be obtained in the ranges mentioned.

Preferably, the bonding layer comprises an AuSn layer and, during melting, forms an AgAuSn phase, from which an AgAuSnPd is then formed, between chip carrier and chip, in particular between the bonding layer and the connection layer.

Further advantageous embodiments are described herein.

BRIEF DESCRIPTION OF THE DRAWINGS

The invention is described below on the basis of an exemplary embodiment explained in more detail by means of figures, in which.

DETAILED DESCRIPTION OF ILLUSTRATIVE EMBODIMENTS

Figure 1:
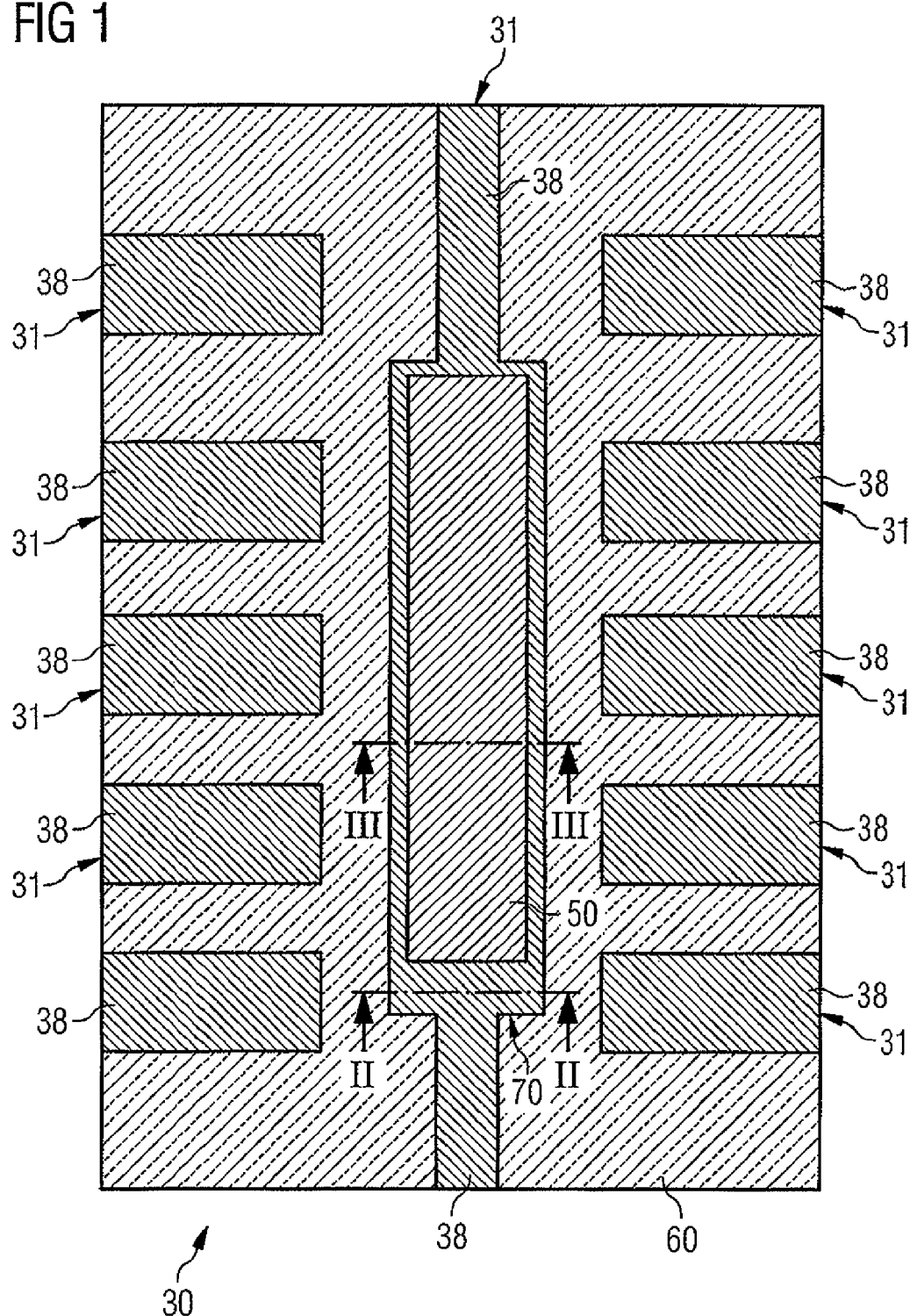
FIG. 1 shows a chip carrier.

In the description below, the same reference numerals are used for identical and identically acting parts.

Figure 3:
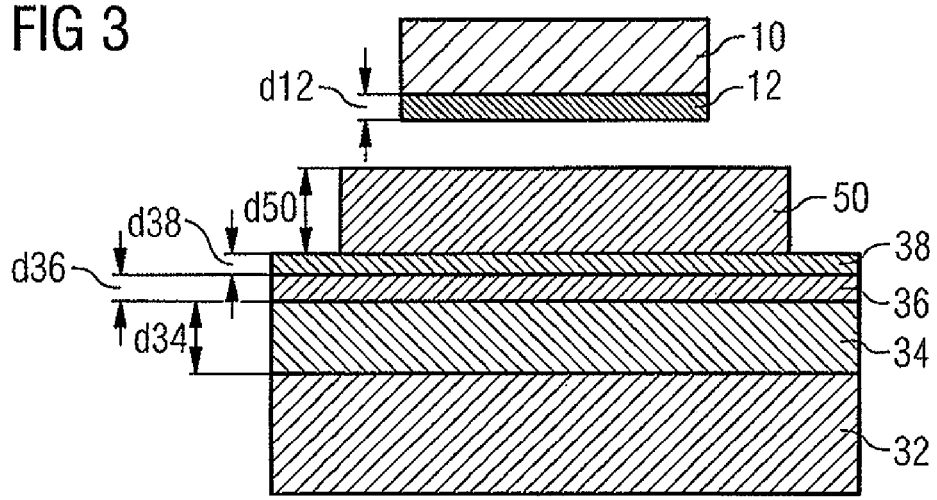
FIG. 3 shows a partial cross section through a second portion of the chip carrier from FIG. 1 and also through a chip.

FIG. 1 shows a schematic plan view of a first embodiment chip carrier 30. The chip carrier 30 preferably is formed essentially in rectangular fashion and has at its edges a plurality of contact regions 31 serving, for a silicon chip 10 (see FIG. 3) applied on the carrier layer 30 later, as connection pieces for further processing. For this purpose, the silicon chip 10 is connected to the contact regions 31 of the chip carrier 30, for example, by means of a fine wiring. Extending centrally along the longitudinal direction of the chip carrier 30 is a web with a rectangular widening, the so-called chip contact location 70, on which the chip 10 is fixed in a further processing step.

The lateral contact regions 31 and also the chip contact location 70 are separated from one another by an intermediate region 60. In a later method step, the intermediate region 60 can be at least partly stripped from the chip carrier 30. The lateral contact regions 31 remain freely movable and can be soldered, for example, to a printed circuit board.

Figure 2:
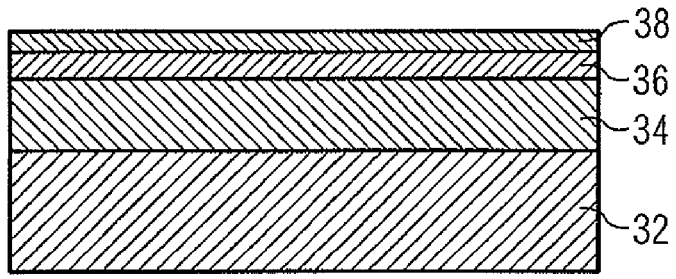
FIG. 2 shows a partial cross section through a first portion of the chip carrier from FIG. 1.

In cross section, the lateral contact regions 31 and also the chip contact locations 70 have a similar construction. As can be seen from FIG. 2, the chip carrier 30 in cross section is subdivided essentially into two functional portions, the substrate and the soldering layer. The substrate situated at the bottom is a copper layer 32 in the present exemplary embodiment. The soldering layer comprises three layers, a nickel layer 34 above the copper layer 32, then a palladium layer 36, and finally a gold layer 38.

The gold layer 38 can be seen in the plan view of the chip carrier 30 from FIG. 1 both in the regions of the lateral contact regions 31 and also in the edge regions of the chip contact location 70.

The main part of the chip contact location 70 is coated, however, with a connection layer, namely a silver layer 50. The construction of the chip carrier 30 in cross section at this location is revealed schematically in FIG. 3. In the lower region, the construction is identical to that from FIG. 2. The copper layer 32 is followed by the nickel layer 34, the palladium layer 36 and the gold layer 38. The latter had applied to it selectively galvanically or chemically a silver layer 50 for later connection to the chip 10, more precisely to the bonding layer thereof, namely an AuSn layer 12. In the cross section illustrated in FIG. 3, the AuSn layer 12 has an AuSn layer thickness $d_{12}$ of approximately 0.5 to 2 micrometers, the silver layer 50 has a silver layer thickness $d_{50}$ of approximately 0.5 to 10 micrometers, the gold layer 38 has a gold layer thickness $d_{38}$ of approximately 5 to 100 nanometers, the palladium layer 36 has a palladium layer thickness $d_{36}$ of approximately 10 to 200 nanometers, and the nickel layer 34 has a nickel layer thickness $d_{34}$ of approximately 1 to 5 micrometers.

Figure 4:
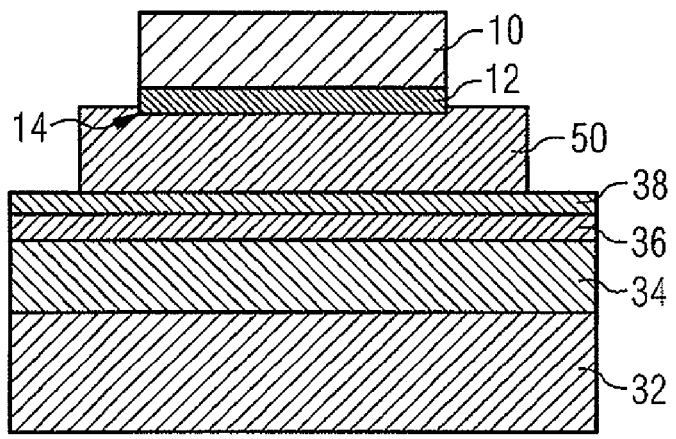
FIG. 4 shows a partial cross section through a chip eutectically bonded to the chip carrier.

The chip contact location 70 constructed in this way can be eutectically connected or bonded to the chip 10 at a temperature of more than 300° C. and a contact pressure of between 5 and 40 megapascals. In this case, a fixed, thermally and electrically conductive connection is formed between the AuSn layer 12 and the silver layer 50. An AgAuSnPd phase 14 arises (from an initially formed AgAuSn phase) (see FIG. 4).

What is claimed is:

1. An electronic circuit arrangement, comprising:
    a chip;
    a chip carrier having a substrate and a chip contact location; and
    a connection layer between the chip contact location and the chip, wherein the connection layer comprises an AgAuSnPd phase.

2. The electronic circuit arrangement of claim 1, further comprising:
    a soldering layer comprising a predominantly palladium-containing layer; and
    a bonding layer comprising an AuSn or AuAs alloy.

3. The electronic circuit arrangement of claim 2, wherein the soldering layer comprises:
    an inner layer adjacent to the substrate, the inner layer comprising nickel or a nickel alloy, the inner layer having a first thickness;
    a middle layer comprising palladium or a palladium alloy, the middle layer having a second thickness, wherein the middle layer is the predominantly palladium-containing layer; and
    an outer layer comprising gold or a gold alloy, the outer layer having a third thickness.

4. An electrical circuit arrangement comprising:
    a substrate;
    a soldering layer disposed over the substrate, wherein the soldering layer comprises a layer of gold or gold alloy, a layer of palladium or palladium alloy, and a layer of nickel or nickel alloy;
    a layer comprising silver arranged over the soldering layer; and
    a eutectic phase layer arranged over the layer comprising silver.

5. The electrical circuit arrangement according to claim 4, wherein the layer comprising silver is in contact with the soldering layer.

6. The electrical circuit arrangement according to claim 4, wherein the layer of gold or gold alloy is arranged directly over the layer of palladium or palladium alloy and the layer of palladium or palladium alloy is arranged directly over the layer of nickel or nickel alloy.

7. The electrical circuit arrangement according to claim 4, wherein the bonding layer comprises a thickness of approximately 0.5 to 2 µm, wherein the layer comprising silver comprises a thickness of approximately 0.5 to 10 µm, wherein the gold or gold alloy layer comprises a thickness of 5 to 100 nanometers, wherein the palladium or palladium alloy layer comprises a thickness of 10 to 200 nanometers, and wherein the nickel or nickel alloy layer comprises a thickness 1 to 5 µm.

8. The electrical circuit arrangement according to claim 4, wherein the eutectic phase layer comprises AgAuSnPd.

9. The electrical circuit arrangement according to claim 4, further comprising a chip arranged over the eutectic phase layer.

10. The electrical circuit arrangement according to claim 4, further comprising a bonding layer disposed over the eutectic phase layer.

11. A chip carrier comprising:
    a substrate having a chip contact location;
    a palladium or palladium alloy layer arranged over the chip contact location; and
    a silver or silver alloy layer arranged over the palladium layer.

12. The chip carrier according to claim 11, wherein a gold or gold alloy layer is arranged between the palladium or palladium alloy layer and the silver or silver alloy layer.

13. The chip carrier according to claim 12, wherein the gold or gold alloy layer is arranged directly over the palladium or palladium alloy layer and wherein the silver or silver alloy layer is arranged directly over the gold or gold alloy layer.

14. The chip carrier according to claim 11, wherein a nickel or nickel alloy layer is arranged between the chip contact location and the palladium or palladium alloy layer.

15. The electronic circuit arrangement according to claim 1, further comprising a soldering layer between the chip contact location and the connection layer, and a silver layer between the soldering layer and the connection layer.

16. The electronic circuit arrangement according to claim 1, wherein the chip comprises a bonding layer.

17. An electronic circuit arrangement, comprising:
    a chip comprising a bonding layer, wherein the bonding layer comprises an AuSn or AuAs alloy;
    a chip carrier having a substrate and a chip contact location; and
    a connection layer between the chip contact location and the bonding layer.

18. The electronic circuit arrangement as claimed in claim 15, wherein the soldering layer is a lead-free soldering layer.

19. The electronic circuit arrangement as claimed in claim 15, wherein the soldering layer comprises a predominantly palladium-containing layer.

20. The electronic circuit arrangement as claimed in claim 15, wherein the silver layer has a layer thickness of between about 0.5 to about 10 micrometers.

21. The electronic circuit arrangement as claimed in claim 15, wherein the soldering layer comprises three layers.

22. The electronic circuit arrangement as claimed in claim 21, wherein the soldering layer comprises:
    an inner layer adjacent to the substrate, the inner layer comprising nickel or a nickel alloy, the inner layer having a first thickness;
    a middle layer comprising palladium or a palladium alloy, the middle layer having a second thickness; and
    an outer layer comprising gold or a gold alloy, the outer layer having a third thickness.

23. The electronic circuit arrangement as claimed in claim 22, wherein:
    the first thickness lies within the range of between approximately 1 and 5 micrometers;
    the second thickness lies within the range of between approximately 10 and 200 nanometers; and
    the third thickness lies within the range of between approximately 5 to 100 nanometers.

24. The electronic circuit arrangement as claimed in claim 16, wherein the bonding layer of the chip has a layer thickness of between 0.5 and 2 micrometers.

25. The electronic circuit arrangement as claimed in claim 16, wherein the bonding layer comprises an AuSn or AuAs alloy.

26. The electronic circuit arrangement as claimed in claim 15, wherein the chip contact location is provided with the soldering layer over essentially the whole area of the chip contact location.

27. The electrical circuit arrangement according to claim 10, wherein the bonding layer comprises an AuSn or AuAs alloy.

* * * * *